United States Patent [19]

Brandner

[11] Patent Number: 4,610,426

[45] Date of Patent: Sep. 9, 1986

[54] PIEZOCERAMIC VALVE PLATE FOR A LOW-PRESSURE INJECTION VALVE AND PROCESS FOR THE PRODUCTION THEREOF

[75] Inventor: Burkhard Brandner, Werdohl, Fed. Rep. of Germany

[73] Assignee: Atlas Fahrzeugtechnik GmbH, Werdohl, Fed. Rep. of Germany

[21] Appl. No.: 752,316

[22] Filed: Jul. 3, 1985

[30] Foreign Application Priority Data

Jul. 10, 1984 [DE] Fed. Rep. of Germany ....... 3425290

[51] Int. Cl.$^4$ .............................................. F16K 31/04
[52] U.S. Cl. .................................. 251/129.06; 310/332
[58] Field of Search .................. 251/129.06; 310/330, 310/332

[56] References Cited

U.S. PATENT DOCUMENTS 4,112,279  9/1978  Brohard ........................... 310/332 X
4,349,762  9/1982  Kitamura et al. .................... 310/332
4,492,360  1/1985  Lee, II et al. .................. 251/129.06

FOREIGN PATENT DOCUMENTS 52-50010  4/1977  Japan ............................. 251/129.06

*Primary Examiner*—Arnold Rosenthal
*Attorney, Agent, or Firm*—Mason, Kolehmainen, Rathburn & Wyss

[57] ABSTRACT

For a low-pressure injection valve, a piezoceramic valve plate as a flexural resonator, the valve plate having a carrier plate and on one side or on both sides silvered piezoceramic plates held by a binding layer. It is the object of the present invention to provide a flexural resonator which comprises within a large temperature range a proper and reliable connection between the carrier plate and the ceramic plate. The carrier plate consists of a metallic glass, and the binding layer is a soft solder with Zn as main component and an alloy suppressor such as Pb, Cd, and/or Ag.

3 Claims, 3 Drawing Figures

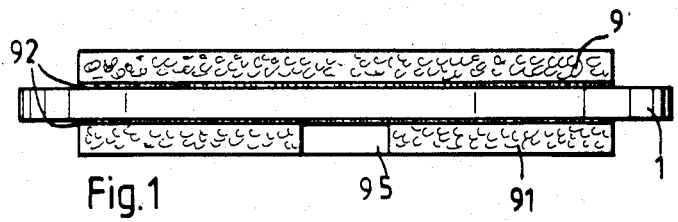
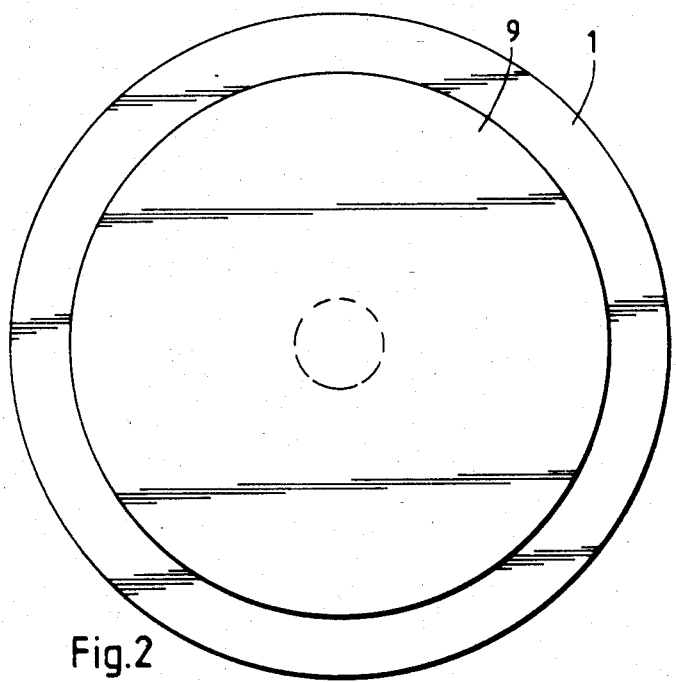

PIEZOCERAMIC VALVE PLATE FOR A LOW-PRESSURE INJECTION VALVE AND PROCESS FOR THE PRODUCTION THEREOF

BACKGROUND OF THE INVENTION

1. Field of the Invention

The invention relates to a piezoceramic valve plate as a flexural resonator, the valve plate having a carrier plate and on one side or on both sides silvered piezoceramic plates held by a binding layer. Said valve plate is designed for a low-pressure injection valve.

2. Description of the Prior Art

In the case of prior art valve plates of this type the carrier plate consists of metal, particularly brass, steel, or the like. The piezoceramic plates are fastened by a binding layer consisting of an adhesive substance. Inter alia it is the function of the adhesive substance to compensate the very different coefficients of expansion between the metallic carrier and the ceramic plate. However, the binding layer consisting of an adhesive substance is adapted to fulfill this function only to a limited extent if the temperature of application is high.

In the case of vehicle-technical applications when the valve plate is utilized for a fuel injection valve the temperature range of application is between −30° C. to +80° C.

SUMMARY OF THE INVENTION

It is the object of the present invention to provide a flexural resonator which comprises within a large temperature range a proper and reliable bond or connection between the carrier plate and the ceramic plate.

According to the invention this object is solved in that the carrier plate consists of a metallic glass and that the binding layer is a soft solder with Zn as the main component and with an alloy suppressor, such as Pb, Cd and/or Ag.

Tests carried out have shown that a soft solder is very suitable for the binding layer. However in such a case the metal was not adapted as material for the carrier plate because the piezoceramic plates broke when cooling down from the soldering temperature.

The present invention differs from the prior art in such a manner that the carrier plate consists of a metallic glass with a very small coefficient of expansion. As metallic glass particularly a so-called fuse-in and sealing alloy is suitable which has an extremely small coefficient of thermal expansion. The soft solder provides a proper and reliable mechanical bond and also electrical connection between the carrier plate and the piezoceramic plate. The alloy suppressor avoids that the silvering of the piezoceramic plate is dissolved and is alloyed into the soft solder.

According to the present invention such a composition of the soft solder is particularly suitable that the soft solder comprises 50 to 70% Sn, 0 to 35% Pb, 0 to 25% Cd, 0 to 3.5% Ag, 0 to 25% Zn, each in percent by weight.

As a further development the invention relates to a process for the production of a valve plate of the said type, which is characterized in that the arrangement of a carrier plate, a soft solder, and a piezoceramic plate is soldered at a soldering temperature close to the smelting temperature of the soft solder and that after the cooling down a polarization of the piezoceramic plate takes place at a temperature of approximately 130° C.

The soldering temperature is chosen as low as possible, in order to load the piezoceramic plate thermally as small as possible and to keep the tendency to form an alloy with the silvering as small as possible. Subsequent to the soldering the polarization of the piezoceramic plate is effected. The entire arrangement may be heated without difficulty to the necessary treating temperature of 130° C. without causing a disadvantageous influence regarding the consistency of the arrangement.

According to the invention the soldering is carried out, expediently, at a temperature between 140° and 260° C.

BRIEF DESCRIPTION OF THE DRAWING

One embodiment of the present invention will be described in the following with reference to the attached drawings, wherein FIG. 1 shows a flexural resonator according to the invention as a view, FIG. 2 is a top view in regard to FIG. 1, whilst

DESCRIPTION OF THE PREFERRED EMBODIMENT

Figure 3:
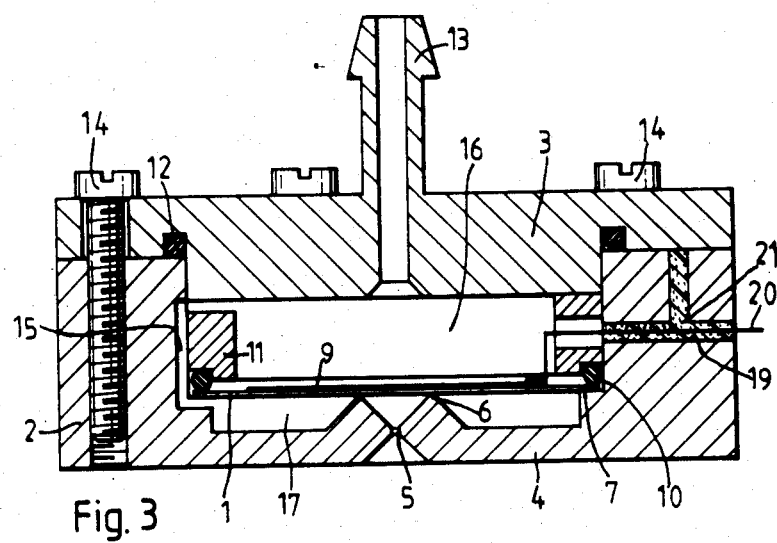
FIG. 3 shows a section through a low-pressure injection valve.

The flexural resonator according to the invention comprises a carrier plate 1. It is a thin metal sheet having a thickness of approximately 0.1 mm. This sheet consists of a metallic glass, particularly a fuse-in and sealing alloy.

On both sides of this carrier plate 1 there is one piezoceramic plate 9, 91 respectively which is connected to the carrier plate 1 via a binding layer 92. The binding layer 92 consists of a soft solder having a low melting temperature and with a composition of 50 to 70% Sn, 0 to 35% Pb, 0 to 25% Cd, 0 to 3.5% Ag, 0 to 25% Zn, each in percent by weight. The alloy components Pb, Cd and/or Ag serve as alloy suppressors, in order to exclude a dissolution and alloy formation with silvering of the piezoceramic plates 9, 91. Each piezoceramic plate 9, 91 has a thickness of approximately 0.1 mm. It is also possible to provide one piezoceramic plate on one side of the carrier plate only.

The diameter of the carrier plate 1 is somewhat larger than the diameter of the piezoceramic plates 9, 91 so that the valve plate can be clamped on the border of the carrier plate 1. A piezoceramic plate 91 may possess in the center a cutout 95 so that the carrier plate 1 may cooperate with a valve seat.

The production of the valve plate is carried out in such a manner that the layers are placed on each other and that a soldering is effected at a temperature between 140° and 200° C. this soldering temperature being chosen as close as possible above the melting temperature of the solder. The soldering time itself should be short, in order to suppress as far as possible alloy formation of the silver layer of the piezoceramic plates 9, 91.

Subsequent to the soldering a polarization of the piezoceramic plates is performed at a temperature of 130° C. The piezoceramic plates may be polarized in the soldered-on condition. The layer arrangement consisting of the carrier plate, the soft solder binding, and the piezoceramic plate allows this temperature treatment. The valve plate can be utilized within a large temperature range of application. A temperature range of application between −30° C. and +80° C. is admissable without difficulties. Consequently, the valve plate may be used in the motor vehicle technique.

FIG. 3 shows a low-pressure injection valve with a piezoceramic valve plate. A valve chamber consists of a cylindrical housing 2 and a housing cover 3. The housing 2 has in its front wall 4 a central nozzle 5 with an annular valve seat 6. Spaced from the front wall 4 an anular step 7 is provided which serves for the support of the carrier plate 1. A packing ring 10 serves for the clamping of the border of the carrier plate 1. The packing ring 10 is held by clamping ring 11.

The housing cover 3 closes with the intermediate position of a packing ring 12 the housing 2. On the housing cover 3 a connecting piece 13 for a fuel line is provided. The housing 2 and the housing cover 3 are kept together by screws 14 or other connecting means.

The border of the carrier plate 1 is positioned on the annular step 7 and serves for the mounting. The carrier plate 1 separates the valve chamber into an inlet space 16 and an outlet space 17. A by-pass channel 15 communicates the two spaces and secures a pressure compensation between these two spaces.

The piezoceramic plate 9 is in contact with an electrode. The carrier plate 1 serves as a counterelectrode. The clamping ring 11 as well as the wall of the housing 2 possess passages 19 for an electrical connection line 20, which is connected to the electrode of the piezoceramic plate 9. The passages 19 are densely filled with a casting and sealing compound 21.

In FIG. 3 a valve plate is shown having only one piezoceramic plate 9 on one side of the carrier plate 1. If one provides a second piezoceramic plate, then the central cutout thereof releases the valve seat so that the carrier plate is placed immediately on the valve seat.

The function of the low-pressure injection valve is evident without difficulty from the above description and from the drawing. To the connecting piece 13 a fuel pressure line is connected which from a pressure source is supplied with fuel under the injection pressure. The fuel fills the valve chamber and particularly the inlet space 16 as well as the outlet space 17. The carrier plate 1 under the pressure of the fuel is in contact with the valve seat 6 and seals the valve seat. A control voltage applied over the connection line 20 effects a deformation of the carrier plate so that the same is lifted from the valve seat 6 and releases the nozzle 5. A voltage of approximately 100 V secures a deformation of the carrier plate 18 in the range of 0.15 to 0.2 mm so that thereby orderly functioning of the low-pressure injection valve is guaranteed.

We claim the following:

1. For a low-pressure injection valve, a piezoceramic valve plate as a flexural resonator, the valve plate having a carrier plate and on one side or on both sides silvered piezoceramic plates held by a binding layer, characterized in that the carrier plate consists of a metallic glass and that the binding layer is a soft solder with Zn as main component and an alloy suppressor such as Pb, Cd, and/or Ag.

2. A valve plate according to claim 1, characterized in that the soft solder contains 50 to 70% Sn, 0 to 35% Pb, 25% Cd, 0 to 3.5% Ag, 0 to 25% Zn, each in percent by weight.

3. A valve plate according to claim 1 or claim 2, characterized in that the piezoceramic plate has a central cutout for a valve seat.

* * * * *

UNITED STATES PATENT AND TRADEMARK OFFICE
CERTIFICATE OF CORRECTION

PATENT NO. : 4,610,426
DATED : September 9, 1986
INVENTOR(S) : Burkhard Brandner It is certified that error appears in the above-identified patent and that said Letters Patent are hereby corrected as shown below:

IN THE ABSTRACT

Front page, line 10, "Zn" should be --Sn--.

IN THE SPECIFICATION

Column 1, line 37, "Zn" should be --Sn--.

IN THE CLAIMS

Claim 1, column 4, line 24, "Zn" should be --Sn--.

Signed and Sealed this

Twenty-seventh Day of January, 1987

Attest:

DONALD J. QUIGG

Attesting Officer       Commissioner of Patents and Trademarks